United States Patent [19]

Tanaka

[11] Patent Number: 5,078,832
[45] Date of Patent: Jan. 7, 1992

[54] METHOD OF TREATING WAFER SURFACE

[75] Inventor: Masato Tanaka, Shiga, Japan

[73] Assignee: Dainippon Screen Mfg. Co., Ltd., Japan

[21] Appl. No.: 518,509

[22] Filed: May 3, 1990

[30] Foreign Application Priority Data

May 6, 1989 [JP] Japan .................................. 1-113921

[51] Int. Cl.$^5$ ............................................. C03C 15/00
[52] U.S. Cl. ................................... 156/639; 156/640; 156/643; 156/646; 134/1; 134/3; 134/31; 134/33
[58] Field of Search ................ 156/639, 640, 646, 643, 156/345; 252/79.3; 134/1, 2, 3, 31, 33, 38, 41, 37

[56] References Cited

U.S. PATENT DOCUMENTS

| | | | |
|---|---|---|---|
| 4,749,440 | 6/1988 | Blackwood et al. | 156/646 |
| 4,765,866 | 8/1988 | Whitwell et al. | 252/79.3 X |
| 4,778,532 | 10/1988 | McConnell et al. | 134/10 |
| 4,816,098 | 3/1989 | Davis et al. | 156/345 |
| 4,857,142 | 8/1989 | Syverson | 156/646 |
| 4,904,338 | 2/1990 | Kozicki | 252/79.3 X |
| 4,931,103 | 6/1990 | Atwater | 156/656 X |

FOREIGN PATENT DOCUMENTS 61-148820 7/1986 Japan .
1-226156 8/1989 Japan .

Primary Examiner—David A. Simmons
Assistant Examiner—Thi Dang
Attorney, Agent, or Firm—Ostrolenk, Faber, Gerb & Soffen

[57] ABSTRACT

A method for treating a main surface of a wafer on which a thin film having micro openings is formed with a treatment agent includes the steps of: making the thin film hydrophilic, supplying water to the surface of the thin film, and supplying the treatment agent in vapor phase to the thin film while spinning the wafer. The rendered hydrophilic thin film causes the water supplied to the surface of the thin film to form a water film having a uniform thickness on the inner surface of the openings as well as on the surface of the thin film. A vapor phase treatment agent supplied dissolves in the water film so as to treat the main surface of the wafer at the bottom of the openings. Even if the wafer is spun at high speed, the treatment agent permeates through the water film into the openings so as to uniformly and efficiently treat the main surface of the wafer.

23 Claims, 10 Drawing Sheets

METHOD OF TREATING WAFER SURFACE

BACKGROUND OF THE INVENTION

1. Field of the Invention

This invention relates generally to a method of treating a thin plate (hereinafter referred to as a "wafer") such as a semiconductor wafer, and more particularly to a method of forming micro holes such as contact holes in a thin film on the wafer by etching, employing as an etching mask material a resist having openings formed in desired patterns. The invention further relates to methods of removing an oxide film from within micro openings such as trenches formed in the surface of the wafer by etching and of cleaning the inside of the openings.

2. Description of the Related Art

An etching technique utilizing photolithography is considered important in the process of manufacturing a highly integrated semiconductor circuit. The following process is carried out, for example, in the formation of a contact hole for connecting an impurity region formed in the surface of the wafer and an interconnection.

On the surface of the wafer to be treated is formed, for example, a positive photoresist film which becomes soluble in alkali by reacting to light. The positive-type photoresist film is exposed in accordance with a pattern to be etched. During development of the exposed positive-type photoresist, only portions irradiated with light dissolve in an alkaline developer being used and thus an opening is formed in the photoresist film in accordance with a desired pattern. An etchant for etching an electrically insulating film on the surface of the wafer is applied over the photoresist film. This causes only the film on the wafer surface exposed by the opening of the photoresist film to be etched so as to form an opening in the wafer surface in accordance with a desired pattern.

As the level of integration of semiconductor integrated circuits has significantly increased, the circuit pattern formed on the wafer have become extremely miniaturized. Accurate etching is required for manufacturing highly integrated semiconductor circuit with high production yields.

It is extremely difficult, however, to accurately etch an extremely miniaturized circuit pattern on a wafer, as pointed out in Japanese Laid-Open Patent No. 61-148820, for example. This difficulty is due to surface tension of a treatment solution being used and to unsmooth flowing of the treatment solution on the photoresist.

Referring to FIG. 1, a common method of treating the surface of a wafer W and problems therewith are described below. The wafer W includes a silicon wafer 20, a thermal silicon oxide film 22 formed on a main surface of the silicon wafer 20, and a photoresist film 24 formed on the thermal silicon oxide film 22. Micro openings 26a and 26b having desired shapes are formed in the photoresist film 24.

The photoresist film 24 is in general a mixture of a compound having a naphthoquinone diazido structure

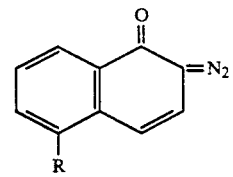

and phenol resin. On the surface of the resist film 24, a methyl group ($-CH_3$) and an ethyl group ($-C_2H_5$) are bonded to a carbon atom C, but a polar group does not exist. Thus, the surface is hydrophobic.

Liquid supplied onto the photoresist is repelled at the surface thereof and becomes a liquid drop by its own surface tension. Therefore, etchant 28 permeates into some openings, for example, the opening 26b in FIG. 1. It may happen, however, that the liquid drop 28 repelled by the photoresist does not permeate into the other opening 26a.

Since the exposed surface of the thermal silicon oxide film 22 is hydrophilic, the thermal silicon oxide film 22 in the opening 26b is etched in the opening 26b by the liquid drop of etchant 28. In the opening 26a, however, the liquid drop of etchant 28 does not reach the surface of the thermal silicon oxide film 22, so that the film 22 is not etched there. That is, some of contact holes are properly formed by etching; however, other contact holes are not formed or are formed incompletely. The uniformed etching results make it impossible to manufacture a highly integrated circuit.

In order to solve the above problems, the above described Japanese Laid-Open Patent No. 61-148820 discloses a method in which the wafer is etched by exposure to a mixed vapor of hydrogen fluoride, water and solvent. Alcohol is proposed as one example of such in solvent.

The proposed etching process proceeds as follows.

(1) Referring to FIG. 2, a wafer W including a silicon wafer 20, a thermal silicon oxide film 22 formed on the silicon wafer 20, and a photoresist film 24 having openings 26a, 26b, formed on the thermal silicon oxide film 22 is exposed to a mixed vapor of hydrogen fluoride 30, water 32 and alcohol 34.

(2) Since the hydrogen fluoride 30, water 32 and alcohol 34 are all in their vapor phases, they are distributed uniformly over all the exposed surfaces of the photoresist film 24 and the thermal silicon oxide film 22.

(3) When the mixed vapor comes in contact with the surface of the thermal silicon oxide film 22, the hydrogen fluoride and water form hydrofluoric acid which then etches the surface of the thermal silicon oxide film 22.

(4) The alcohol 34 is cooled and thus liquified when it comes in contact with the surface of the wafer W. The liquified alcohol rinses and removes the reaction product produced by etching on the surface of the thermal silicon oxide film 22. This prevents the surface of the wafer W from being contaminated with the reaction product produced by etching.

As described above, the hydrofluoric acid is supplied in the form of vapor onto the surface of the wafer W in the proposed processing steps. The vapor reliably permeates even into the micro openings 26a, 26b and is liquified at the surface of the wafer W so as to etch the thermal silicon oxide film 22. Similarly, the alcohol vapor permeating into the openings 26a, 26b is liquified at the surface of the wafer W so as to rinse the reaction product produced by etching. Therefore, according to these processing steps, the shortcomings associated with etching using a micro pattern including uneven treatment of the openings 26a, 26b are avoided.

The above-described conventional art discloses the steps of etching a stationary wafer. In general, however, more uniform treatment can be expected by performing the etching processing while spinning the wafer. At increased spinning speeds, uniformity of the treatment results are enhanced. The etching rate is higher in a spinning wafer than in a stationary wafer.

However, application of the above-described conventional etching approach to a spinning wafer causes the following disadvantages. When the wafer with the micro openings such as contact holes, trenches, etc. formed in its surface is spinning, the air present in the micro openings and the outside air are hardly interchanged, i.e. mixed with each other. Even if the vapor of the hydrofluoric acid is supplied to the spinning wafer, the vapor does not permeate into the micro openings. As the spinning speed increases, the permeation of the vapor into openings becomes more and more difficult. Therefore, it is impossible to obtain a good result by applying the above described conventional art to a spinning wafer.

Even worse, as the dimension of the openings is decreased, the permeation of the hydrofluoric acid into the openings becomes difficult. In the case of an opening with an approximately 200 $\mu$m diameter, for example, it is possible to etch the surface of the wafer within the opening on the stationary wafer as well as on the wafer spinning at 3000 rpm. However, when the diameter of the opening is reduced to approximately 3.0 $\mu$m, it is only possible to etch the opening of a stationary wafer; when the wafer is spun at spinning speed exceeding 80 rpm, it is significantly difficult to obtain good etching. When the opening diameter is reduced to as far as 1.2 $\mu$m or less, it is totally impossible to etch a wafer spinning at 80 rpm or more.

It is possible to etch the wafer when it spins at 80 rpm or less. But in such a case, it is still impossible to obtain uniform etching.

SUMMARY OF THE INVENTION

One object of the present invention is therefore to provide a method of uniformly treating the surface of a wafer on which a thin film having micro openings is formed while spinning the same.

Another object of the present invention is to provide a method of allowing a treatment agent to permeate into each of the micro openings which are formed in a thin film formed on the surface of a wafer while spinning the wafer.

A further object of the present invention is to provide a method of forming a treatment solution film in each of the micro openings formed in a thin film formed on the surface of a wafer while spinning the wafer.

A still further object of the present invention is to provide a method of uniformly etching the surface of a wafer in each of the micro openings formed in a thin film formed on the surface of the wafer while spinning the wafer at spinning speeds of 80 rpm or more.

The foregoing objects can be achieved by a method of treating the wafer, including the steps of: rendering hydrophilic a thin film having openings formed on a main surface of the wafer, supplying water to the surface of the thin film, supplying a treatment agent in vapor phase to the thin film while spinning the wafer, and etching the wafer.

According to a preferred embodiment of the present invention, the treatment agent contains hydrogen halogenide, preferably hydrogen fluoride.

The thin film which is made hydrophilic can easily unite with or take up water. The supplied water forms a water film uniformly on the surface of the thin film. The hydrophilic surface of the thin film facilitates permeation of water even into the openings. Thus, the water film is also formed uniformly on the hydrophilic surface of the thin film at side surfaces of the openings and on the wafer surface in the openings.

The supplied treatment agent in vapor phase, preferably hydrogen halogenide, or more preferably hydrogen fluoride, is dissolved in the water film and introduced into the openings. The treatment agent introduced into the openings etches the surface of the wafer. Even if the wafer is spinning, the treatment agent in vapor phase is easily dissolved in the water film. The treatment agent is easily introduced as an aqueous solution into the openings, so that the surface of the wafer is etched more uniformly.

According to another aspect of the present invention, a method of treating the wafer having the thin film and the openings formed on the main surface includes the steps of supplying a mixture of a predetermined hydrophilic agent serving to make the thin film hydrophilic and water into the thin film, and supplying a treatment agent in vapor phase into the thin film while spinning the wafer.

According to a preferred embodiment of the present invention, the mixture of hydrophilic agent and water is supplied in vapor phase into the thin film.

The mixture of the hydrophilic agent and water reaches the surfaces of the thin film and the inner surface of the micro openings. The hydrophilic agent makes the surface of the thin film and the inner surface of the micro openings hydrophilic, and at the same time water forms a film on the hydrophilic surface. A vapor of a treatment agent such as hydrogen halogenide is supplied while spinning the wafer. The hydrogen halogenide is well dissolved in the water film to treat the surface of the wafer. If the mixture of hydrophilic agent and water is supplied in vapor phase, the hydrophilic agent and water are also easily introduced into the openings. Further, it decreases the possibilities that impurities or the like will adhere to the surfaces of the wafer.

According to still another aspect of the invention, the method is applied to heat a main surface of a wafer having micro openings formed in the main surface. Each of the openings has an interior surface. The method includes the steps of: (a) rendering hydrophilic the interior surface of the micro openings; (b) supplying the main surface of wafer and micro openings with pure water or vapor thereof; (c) supplying the main surface of the wafer and the micro openings with hydrogen fluoride or the vapor including the same, simultaneously with or after the step (b).

The surface rendered hydrophilic attracts water. Therefore, in the step (b), the supplied water forms a thin film on the main surface of the wafer and the interior surface of the micro openings. Hydrogen halogenide or vapor thereof diffuses into the water film and treats the main surface of the wafer.

Hydrogen fluoride of the vapor thereof easily and uniformly diffuses into the water film. As the water film is formed on the interior surface of the micro openings, hydrogen fluoride easily gets into the micro openings. Thus, the main surface of the wafer exposed by the micro openings can be uniformly treated.

According to yet another aspect of the invention, the method includes the step of: (a) supplying the micro openings formed on the main surface of the wafer with wafer solution or a vapor thereof, while the wafer is preferably being spun. The solution and the vapor thereof are effective for rendering hydrophilic the interior surface of the micro openings. As a result of the step (a), a water film is formed on the interior surface of the micro openings. The method further includes the step of (b) supplying the micro openings with hydrogen halogenide or a vapor including the same.

As a result of step (b), the hydrogen halogenide diffuses into the water film, gets into the micro openings via water film, and treats the surface of the wafer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First embodiment

Figure 1:
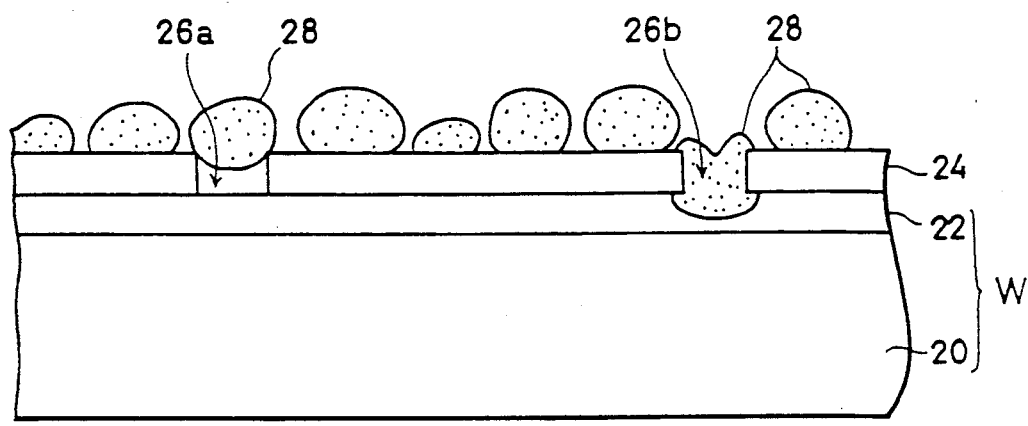
FIG. 1 is a cross sectional view of a wafer in accordance with a conventional method.
Figure 2:
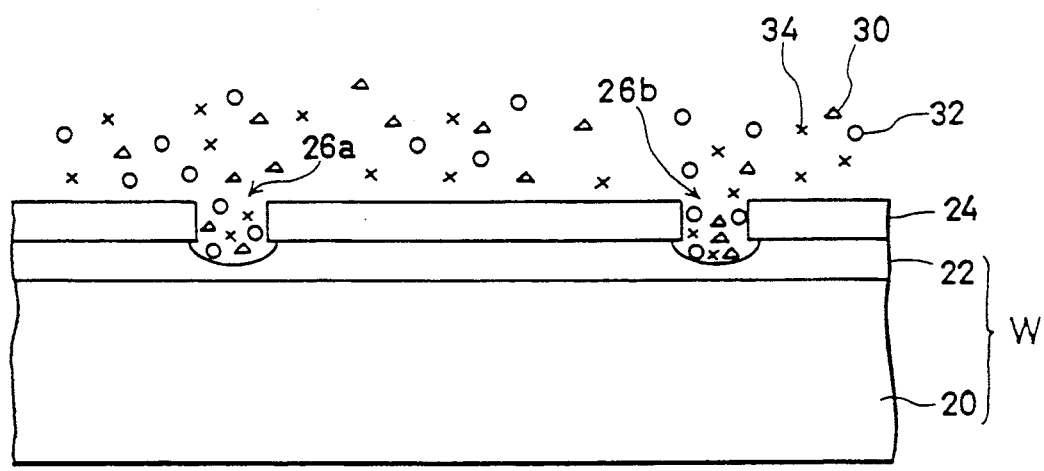
FIG. 2 is a cross sectional view of the surface of a wafer in accordance with another conventional method.
Figure 3:
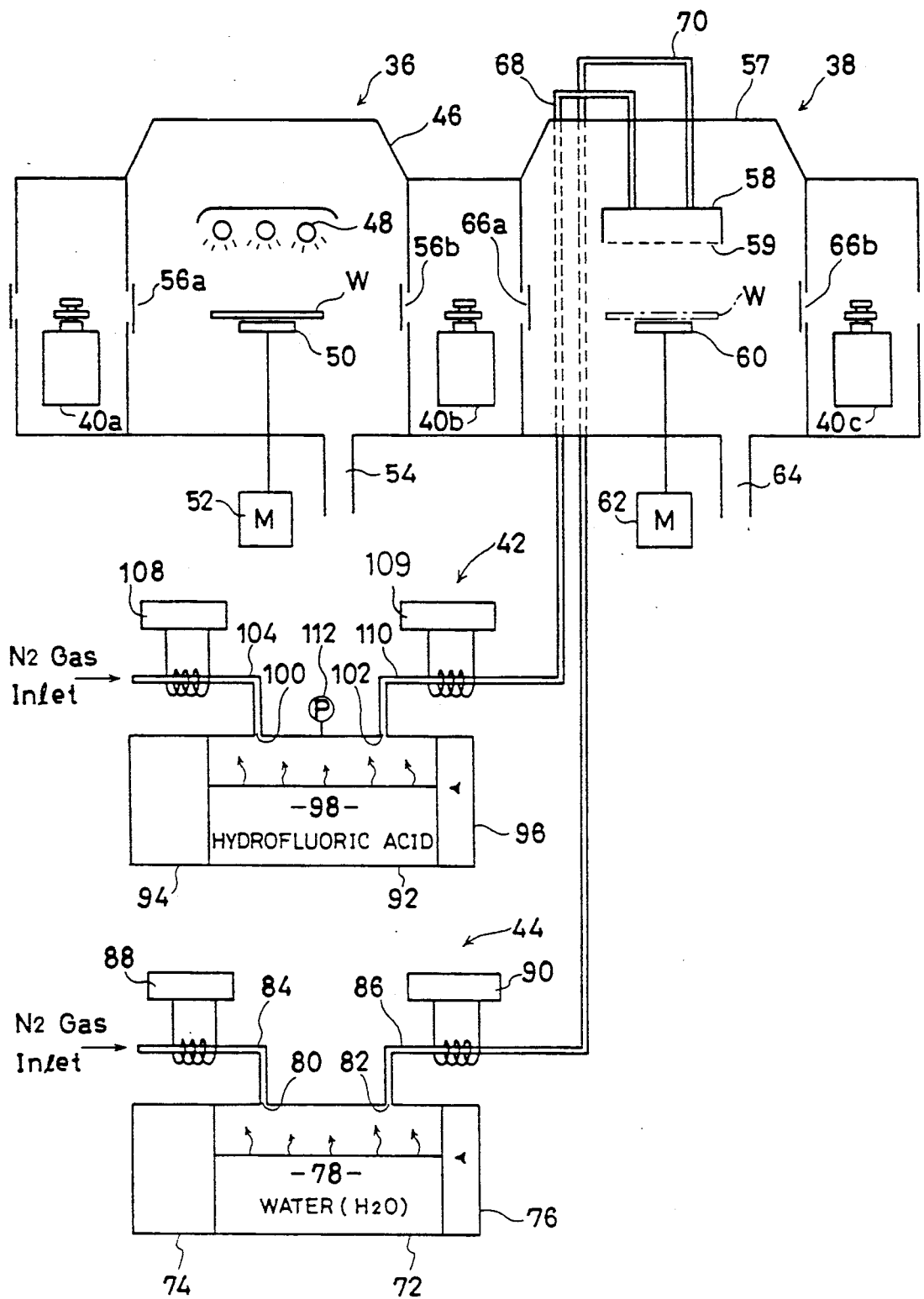
FIG. 3 is a schematic view of a device for carrying out a method of treating the surface of a wafer according to the present invention.

Referring to FIG. 3, a device for carrying out a method of treating the surface of a wafer according to the present invention includes a hydrophilic processing portion 36 for making the surface of a wafer W hydrophilic, an etching processing portion 38 for supplying an etchant to the wafer W the surface of which is made hydrophilic at the hydrophilic processing portion 36 so as to etch the wafer W, wafer conveyers 40a, 40b and 40c for transporting the wafer W from a preceding step to the hydrophilic processing portion 36, from the hydrophilic processing portion 36 to the etching processing portion 38, and from the etching processing portion 38 to succeeding steps. These succeeding steps include a vapor generating portion 42 connected through a pipe 68 to the etching processing portion 38, for supplying a vapor of hydrofluoric acid 98 to the surface of the wafer W, and a water vapor generating portion 44 connected through a pipe 70 to the etching processing portion 38, for supplying a water vapor to the surface of the wafer W.

The hydrophilic processing portion 36 includes a hydrophilic processing chamber 46 for defining a space where the hydrophilic processing is performed, a spin chuck 50 provided in the hydrophilic processing chamber 46 for holding the wafer W by vacuum suction or the like, a motor 52 for spinning the spin chuck 50, and an ultraviolet-ray lamp 48 provided at upper portions in the hydrophilic processing chamber 46, for directing ultraviolet rays onto the wafer W to make the surface of the wafer W hydrophilic.

A wafer inlet through which the wafer W is transported is provided at one side surface of the hydrophilic processing chamber 46. The wafer inlet is covered with a slidable hydrophilic chamber shutter 56a provided at the side surface of the hydrophilic processing chamber 46. The hydrophilic processing chamber 46 further has a wafer outlet at the other sidewall, through which the wafer W made hydrophilic is transported. The wafer outlet is covered with a slidable shutter 56b provided on a side panel of the hydrophilic processing chamber 46.

The etching processing portion 38 includes an etching processing chamber 57 for defining a space where the etching processing is carried out, a spin chuck 60 provided in the etching processing chamber 57, for holding the wafer W by vacuum suction or the like, a motor 62 for spinning the spin chuck 60, and a vapor supplier 58 provided at upper portions in the etching processing chamber 57, for supplying hydrofluoric acid or water vapor to the wafer W through a perforated plate 59. An exhaust duct 64 is provided below the etching processing chamber 57. A wafer inlet to let the wafer W in is provided at the side surface of the etching processing chamber 57 on the hydrophilic processing portion 36 side. The wafer inlet is covered with a slidable etching chamber shutter 66a. A wafer outlet through which the wafer W already subjected to the etching processing is transported out is provided at the sidewall of the etching processing chamber on the opposite side to the wafer inlet. The wafer outlet is covered with a slidable etching chamber shutter 66b.

Figure 4:
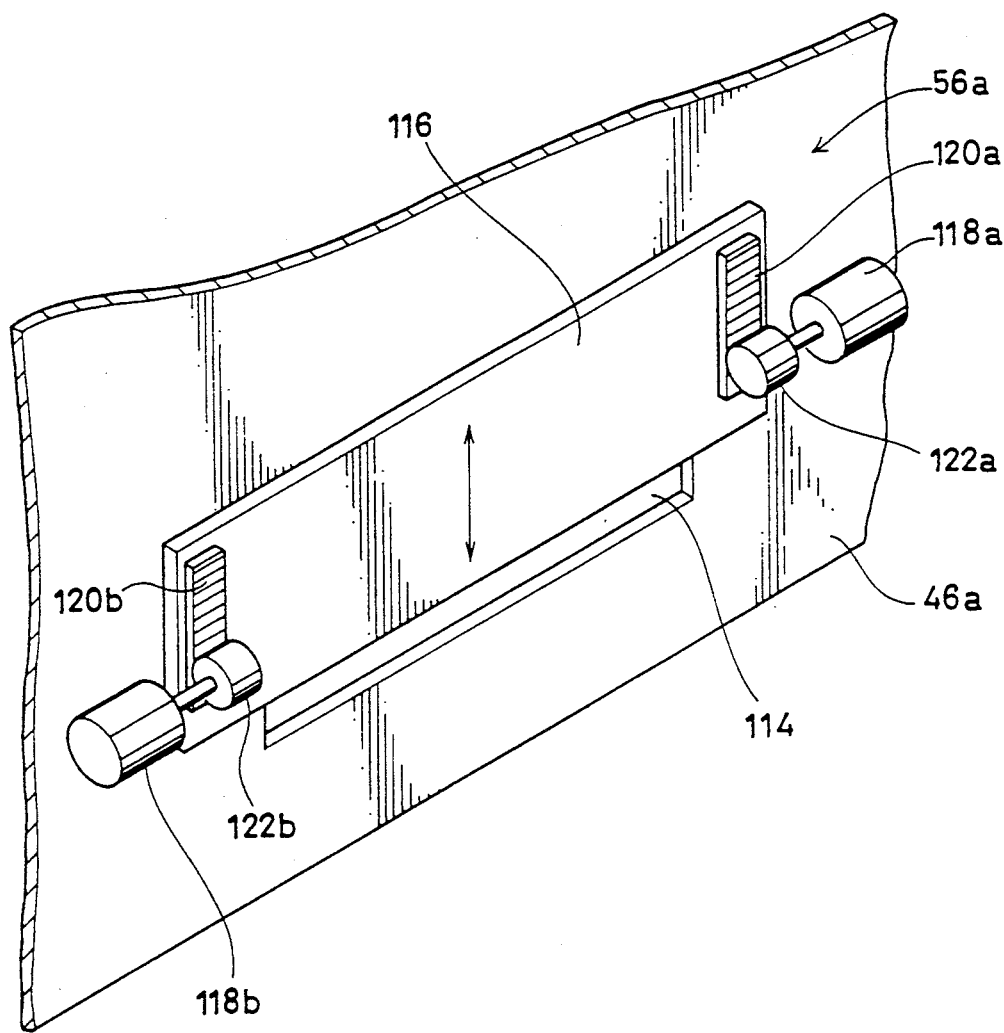
FIG. 4 is a perspective view of a shutter mechanism of the device shown in FIG. 3.

The shutters 56a, 56b, 66a and 66b have a common structure. Referring to FIG. 4, the hydrophilic processing chamber shutter 56a includes, for example, a pair of motors 118a, 118b secured to a sidewall 46a of the chamber 46 and opposed to each other across a wafer inlet 114, pinions 122a, 122b mounted on distal ends of rotary shafts of the respective motors 118a, 118b, a shutter 116 slidable to cover the wafer inlet 114, and racks 120a, 120b secured to opposite sides of the shutter 116 to mesh with the pinions 122a, 122b, respectively. The two motors 118a, 118b are rotatable in the same predetermined direction to raise the shutter 116 and open the wafer inlet 114. The inlet 114 is closed by reversing the rotation of the motors 118a, 118b.

Figure 5:
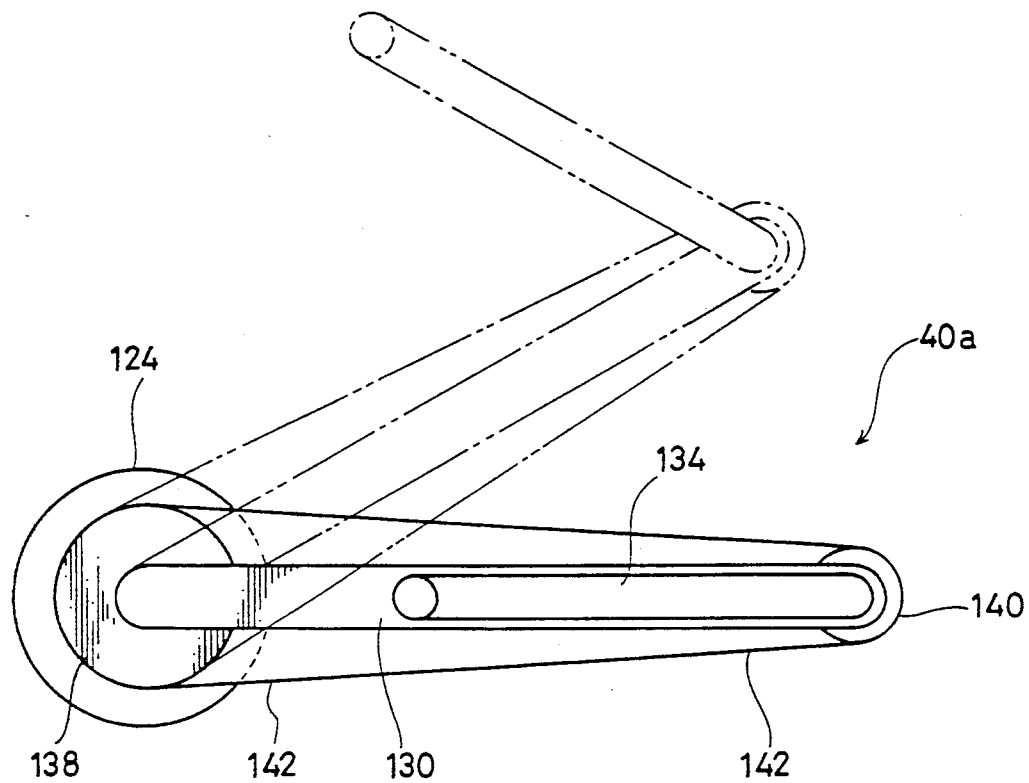
FIG. 5 is a plan view of a wafer conveyer.
Figure 6:
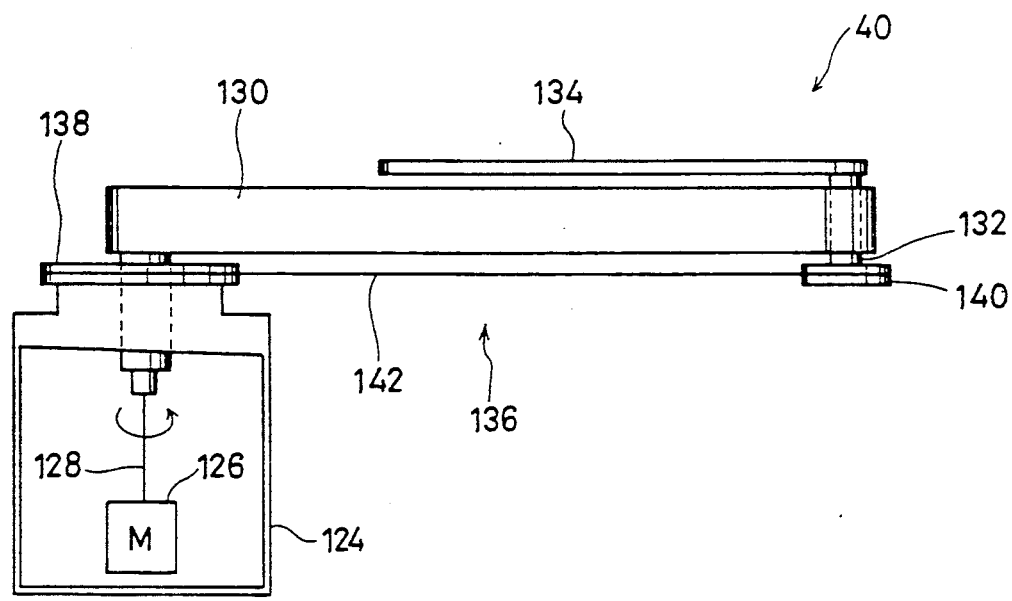
FIG. 6 is a front view of the wafer conveyer.

Referring to FIGS. 5 and 6, the wafer conveyer 40a includes a first arm 130 pivotable about a rotary axis 128 supported on a frame 124, a second arm 134 pivotable about a rotary axis 132 mounted at a free end of the first arm 130, and an arm drive mechanism 136 for driving the second arm 134 in interlocked relation with the movement of the fist arm 130. The arm drive mechanism 136 includes a first pulley 138 fixed to the frame 124, a second pulley 140 fixed to a lower end of the rotary axis 132 to be rotatable therewith, a motor 126 for rotating the axis 128, and a transmission belt 142 for operatively interconnecting the first and second pulleys 138 and 140. The second pulley 140 has a smaller diameter than that of the first pulley 138.

In operation, the rotary axis 128 is rotated in one direction by the motor 126, which turns the first arm 130 in the counterclockwise direction. The first pulley 138 does not rotate, whereby the second pulley 140 rotates in the clockwise direction driven by the transmission belt 142. Since the pulley 140 has a smaller diameter than the pulley 138, the second arm 134 swings through a larger angle than the turning angle of the fist arm 130 in the clockwise direction. The second arm 134 may include a suction port or the like in a distal region thereof for holding wafer W.

The hydrogen fluoride vapor generator 72 includes a hydrofluoric acid tank 92 having a nitrogen gas inlet 100 and a hydrogen fluoride outlet 102. In the tank 92 hydrofluoric acid is evaporated in a concentration of azeotropic mixture, for example, (37.73% at 111.4° C.) under nitrogen pressure. The vapor generator 42 further includes a temperature control device 94 associated with the hydrofluoric acid tank 92 for maintaining the hydrofluoric acid at a predetermined constant temperature, a liquid amount control device 96 for maintaining the hydrofluoric acid at a constant amount, and a pressure gauge 112 for detecting the pressure in the tank 92.

A pipe 104 is connected to the nitrogen gas inlet 100, with a heater 108 provided on the pipe 104 for maintaining the nitrogen gas at a constant temperature. To the hydrogen fluoride vapor outlet 102 is connected a pipe 110 having a heater 109 for heating the hydrogen fluoride vapor discharged from the tank 92 to prevent condensation of the vapor.

The water vapor generating portion 44 includes a tank 72 having a nitrogen gas inlet 80 and a water vapor outlet 82, a temperature regulator 74 for maintaining the temperature of pure water 78 in the tank 72 at a predetermined definite temperature, a water amount regulator 76 for keeping a water level of the water 78 in the tank 72 at a predetermined definite level, a pipe 84 connected to the inlet 80, for guiding nitrogen gas externally supplied into the tank 72, a heater 88 provided with respect to the pipe 84, for maintaining the temperature of the nitrogen gas at a definite temperature, a pipe 86 for connecting the outlet 82 and the pipe 70, and a heater 90 provided with respect to the pipe 86, for preventing decreasing of the temperature of pure water vapor which is introduced through the pipe 86 into the etching processing chamber 38.

With reference to FIGS. 3-7E, the operation of the above device and a method of treating the surface of the wafer according to the present invention is as follows. Referring to FIG. 7A, the wafer W includes a silicon wafer 20, a thermal silicon oxide film (th-SiO$_2$) 22 formed over the whole surface of the silicon wafer 20, and a positive-type photoresist film 24 formed on the thermal silicon oxide film 22. In the photoresist film 24, a large number of micro openings 26 are lithographically formed in accordance with a predetermined pattern.

The positive photoresist film 24 is, in general, a mixture of a compound containing naphthoquinone diazido and phenol resin, as described above. A methyl group (—CH$_3$) and an ethyl group (—C$_2$H$_5$) are bonded to a carbon atom C at the surface of the photoresist film 24.

Since no polar group exists at the surface of the photoresist film 24, the surface thereof is hydrophobic. The diameter of each of the micro openings 26 is in the range of 1.0-3.0 $\mu$m.

First, the wafer conveyer 40a takes the wafer W out of the preceding step. The shutter 56a is raised to open the wafer inlet of the hydrophilic processing chamber 46. The wafer conveyer 40a places the wafer W on the spin chuck 50 through the wafer inlet. The spin chuck 50 holds the wafer W by suction or the like. The shutter 56a is closed after the wafer conveyer 40a withdraws its arm to the outside from the hydrophilic processing chamber 46.

Figure 7A:
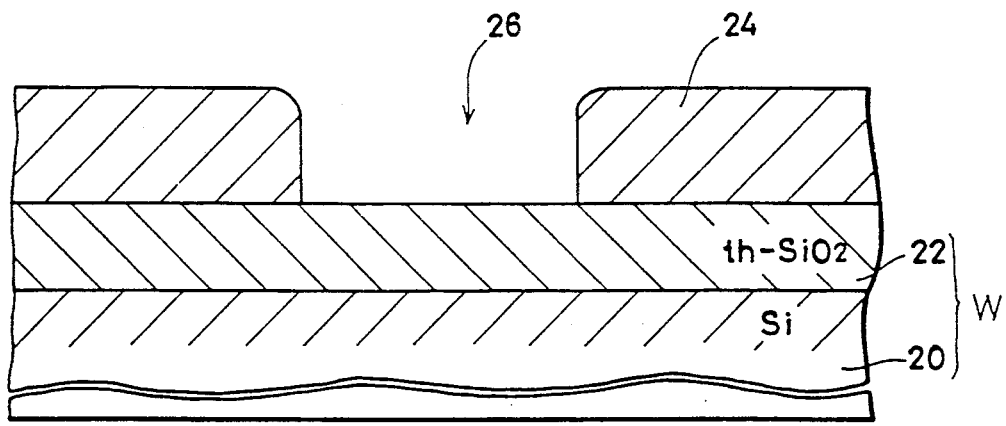
FIGS. 7A–7E are cross sectional views of the surface of the wafer.
Figure 7B:
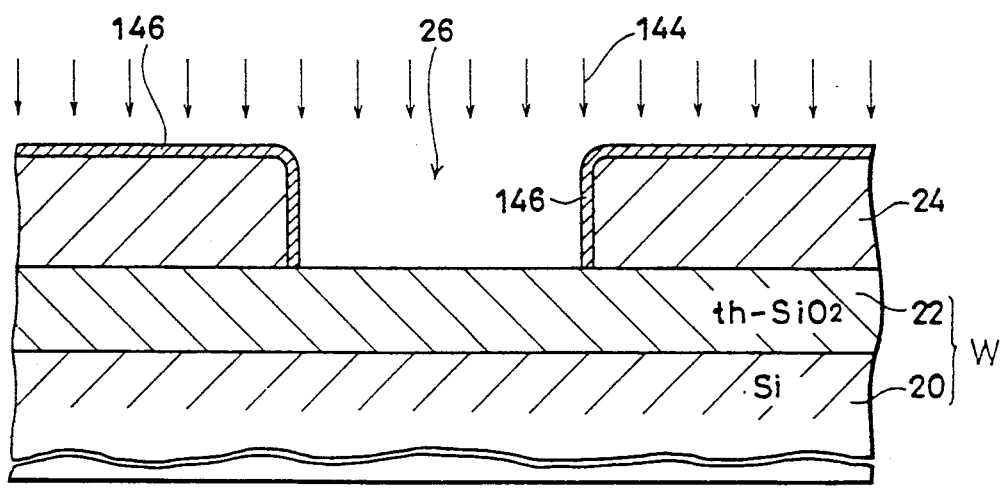

The motor 52 spins the spin chuck 50 and wafer W. Referring to FIG. 7B, the ultraviolet-ray lamp 48 made such as of a low-pressure mercury lamp directs ultraviolet rays 144 (at a wavelength of 184.9-253.7 nm) to the surface of the wafer W.

As shown in FIG. 7B, the irradiation of the ultraviolet rays 144 produces active oxygen and changes the property of the surface of the photoresist film 24 so as to form a hydrophilic photoresist film 146. This change in property is performed by bonding of a hydroxyl group (—OH) and a carboxyl group (—COOH) to a carbon atom C in the surface of the photoresist film 24. Such an improvement in the property of the surface of a macromolecular compound such as the photoresist film 24, which is caused by being exposed to ultraviolet rays, plasma atmosphere, ozone atmosphere, electrons, free radical particles and so on, is described in, for example, an article entitled "Improvements in Properties of Surfaces of Macromolecular Materials by Low Temperature Plasma Processing" by Yasunori Taru et al. The hydrophilic resist film 146 is formed not only on the surface of the resist film 24 but also on the inner surface of the opening 26. After the surface of the photoresist film 24 is made hydrophilic, again referring to FIG. 3, the shutter 56b is opened so that the wafer conveyer 40b transports the wafer W out of the hydrophilic processing chamber 46.

Then, the shutter 66a of the etching processing chamber 57 is opened. The wafer conveyer 40b transports the wafer W into the etching processing chamber 57 through the wafer inlet. The wafer W is mounted on the spin chuck 60. The spin chuck 60 holds the wafer W by vacuum suction or the like.

In the water vapor generating portion 44, a pure water vapor is constantly generated by the temperature regulator 74 and the water amount regulator 76. The generated pure water vapor is supplied through the pipes 86 and 70 to the vapor supplier 58, along with nitrogen gas, while being kept in the state of vapor by the heater 90. The vapor supplier 58 supplies the pure water vapor to the surface of the wafer W through the perforated plate 59. At this time, the wafer W is being spun at high speed with the spin chuck 60 by the motor 62.

Figure 7C:
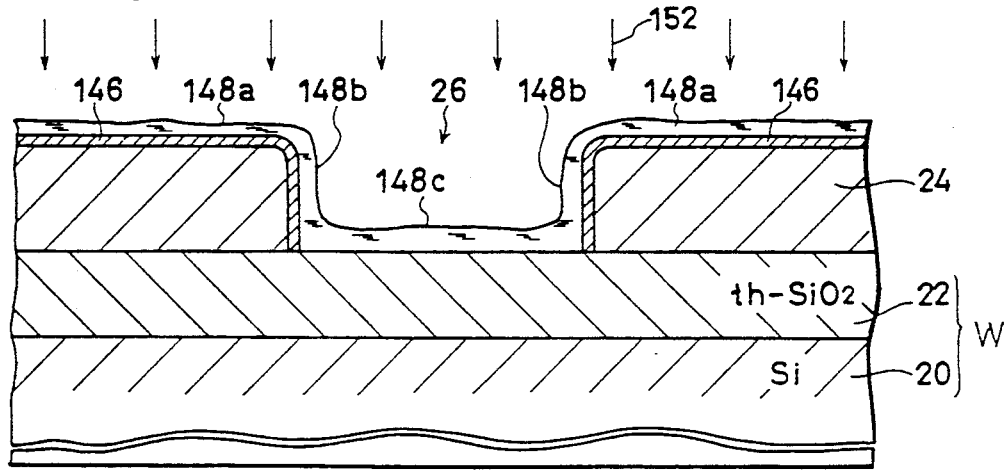

Referring to FIG. 7C, a pure water vapor 152 which reached the surface of the wafer W is liquified at the surface of the hydrophilic resist film 146. Water is bonded to the hydroxyl group (—OH) and the carboxyl group (—COOH) on the hydrophilic resist film 146. The surface of the hydrophilic resist film 146 and that of the thermal silicon oxide film 22 in the opening become wet with water. As a result, a first water film 148a is formed on the surface of the hydrophilic resist film 146, a second water film 148b is formed on the hydrophilic resist film 146 on the inner surface of the opening 26, and a third water film 148c is formed on the surface of the thermal silicon oxide film 22 in the opening 26. The water films 148a, 148b and 148c have approximately uniform thicknesses. Since the thermal silicon oxide film 22 is intrinsically hydrophilic, the water film 148c is formed thereon satisfactorily. Therefore, the overall surface of the wafer W is covered with the water films 148a, 148b and 148c.

In the foregoing description, a pure water vapor is supplied onto the wafer W by the water vapor generating portion 44. However, other methods of forming water film on the wafer W are possible. For example, a supply of pure water in liquid phase can be supplied onto the surface of the wafer W by a nozzle or the like makes it possible to obtain the same result.

After the water film is formed on the wafer W, the supply of the water vapor from the water vapor generating portion 44 is stopped.

In the next step, the wafer W together with the spin chuck 60 is made to spin at a high speed (1000–3000 rpm). The hydrofluoric vapor generating portion 42 generates the vapor of hydrofluoric acid 98 and supplies the same along with nitrogen gas to the vapor supplier 58 through the pipes 110 and 68. The vapor supplier 58 supplies the vapor of hydrofluoric acid evenly onto the surface of the wafer W through the perforated plate 59.

In FIG. 3, the concentration of the hydrofluoric acid 98 is azeotropic, and its temperature is kept at an azeotropic temperature. Pressure in the tank 92 is kept at an azeotropic pressure. The hydrogen fluoride thus kept azeotropic offers the advantage that the ratio of hydrogen fluoride to water vapor in the hydrofluoric acid vapor supplied into the etching processing chamber 38 is kept constant. Further, since the ratio of hydrogen fluoride to water evaporated from the hydrofluoric acid 98 is equal to the azeotropic concentration, another advantage is offered in that a liquid amount regulator 96 need merely supply into the tank 92 the hydrofluoric acid which is at the azeotropic concentration. Moreover, since the hydrofluoric acid is evaporated under nitrogen gas pressure the concentration of the hydrofluoric acid vapor introduced into the etching processing chamber 57 is kept comparatively low. If the hydrofluoric acid vapor should leak outside by accident, it is less dangerous. The method of supplying the hydrofluoric acid is, however, not limited to the evaporation of the hydrofluoric acid at the azeotropic concentration. For example, it may be a vapor of $HF/H_2O$ containing 50% of water and hydrogen fluoride, or alternatively hydrogen chloride HCl.

Figure 7D:
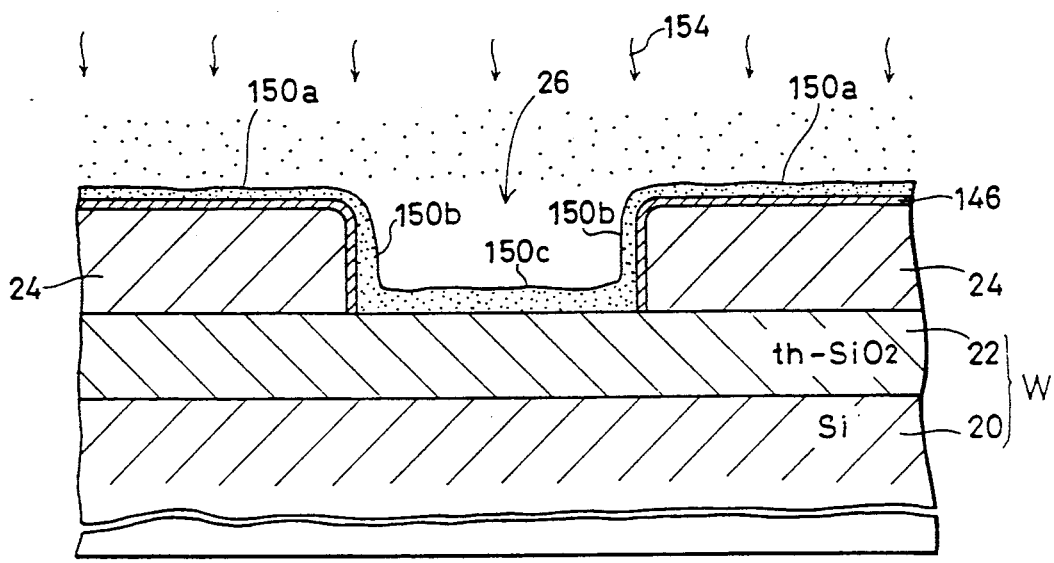

With reference to FIG. 7D, a hydrofluoric acid vapor 154 supplied uniformly reaches the surface of the wafer W. The hydrofluoric acid vapor 154 is dissolved in the water films 148a, 148b and 148c shown in FIG. 7C so as to form hydrofluoric acid solutions 150a, 150b and 150c, as shown in FIG. 7D. Since the hydrofluoric acid vapor 154 is in vapor phase, it easily permeates the opening 26 and forms the hydrofluoric acid solution 150c on the thermal silicon oxide film 22.

Figure 7E:
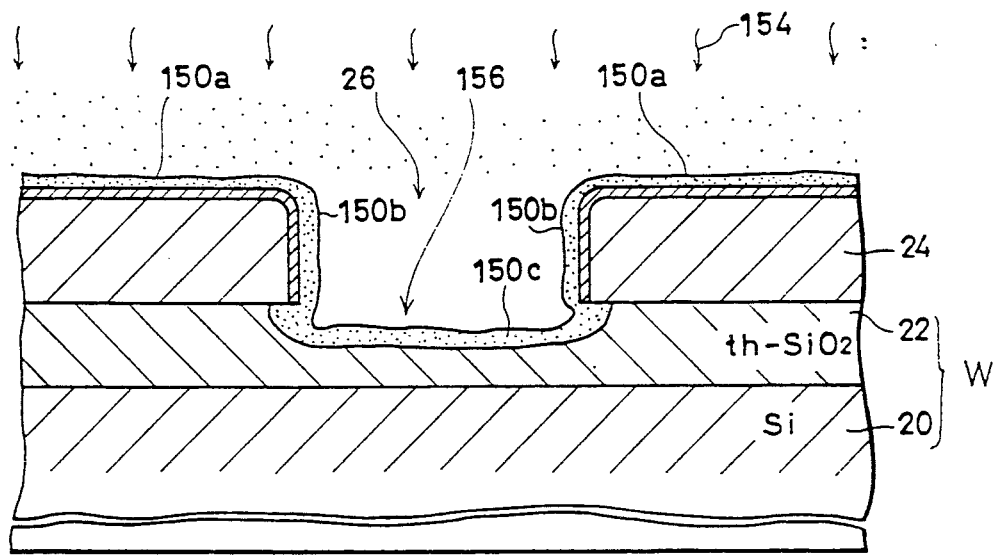

Referring to FIG. 7E, the photoresist film 24 is not eroded with the hydrofluoric acid solution 150a or 150b. The thermal silicon oxide film 22 is, however, isotropically etched in both the vertical and horizontal directions with the hydrofluoric acid solution 150c. Consequently, a contact hole 156 is formed in the thermal silicon oxide film 22 within the opening 26.

The hydrofluoric acid vapor 154 is favorably dissolved in the water film on the surface of the film 24, even while the wafer W is spinning at high speed. Even in a case where the wafer W spins at an especially high speed, so that the hydrofluoric acid vapor 154 cannot easily permeate directly into the opening 26, the vapor 154 is easily dissolved in the water film on the surface of the hydrophilic photoresist film 146. The hydrofluoric acid solution 150c is uniformly formed on the thermal silicon oxide film 22 due to the flow of the hydrofluoric acid solution 150a thus formed on the surface of the hydrophilic photoresist film 46 into the opening 156. Therefore, the hydrofluoric acid solution 150c is formed uniformly on the thermal silicon oxide film 22 independently of the spinning speed of the wafer W. The contact hole 156 is also formed favorably. The high-speed spinning of the wafer W makes it possible to form all contact holes 156 uniformly over the entire surface of the wafer.

The photoresist film 24 can be made hydrophilic not only by being irradiated with the ultraviolet rays 144. It is also possible to make the surface of the photoresist film 24 hydrophilic by, for example, supplying ozone onto the surface of the film 24 simultaneously with the ultraviolet rays, by exposing the surface of the wafer W to ozone atmosphere, by exposing the surface of the wafer W to $O_2$ plasma atmosphere, etc.

While the hydrofluoric acid vapor 154 is supplied after the formation of the water film on the wafer W in accordance with the foregoing description, the hydrofluoric acid vapor 154 and pure water in liquid phase or vapor of pure water may be supplied at the same time.

In this case also, the hydrofluoric acid vapor 154 can be replaced by anhydrous gaseous hydrogen fluoride HF.

Further, the vapor of "hydrofluoric acid $HF+H_2O$" or the anhydrous gaseous hydrogen fluoride HF can be replaced by any of hydrogen chloride solution ($HCl+H_2O$) vapor, gaseous hydrogen halogenide, or vapor containing hydrogen halogenide such as anhydrous gaseous hydrogen chloride HCl.

While the wafer is spun at high speed in the step of making the resist film hydrophilic and in the step of supplying the pure water vapor to the photoresist film in the above-described embodiment, the present invention is not so necessarily limited. The wafer W may be held stationary in each of those steps.

Description of an Experiment

Employing a wafer, on the surface of which a photoresist film having micro openings is formed, an experiment was carried out for studying the relationship between the size and characteristics of the micro openings upon etching.

Experiment for Comparison

Etching only by a vapor of hydrofluoric acid without hydrophilic processing or water film formation.

Figure 9:
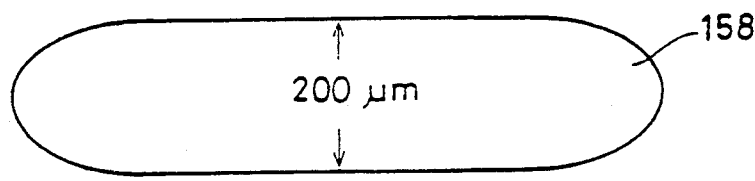
FIG. 9 is a plan view of an oblong groove formed in the surface of the wafer.

A silicon wafer is prepared, on the surface of which a thermal silicon oxide film is formed. On the thermal silicon oxide film is formed a photoresist film having micro openings in the form of an approximately 1.2 $\mu m$ diameter circle, a 3.0 $\mu m$ wide rectangle, and a 200 $\mu m$ wide oblong groove. The planar form of the 200 $\mu m$ wide oblong groove is as shown in FIG. 9. The larger diameter of this groove is 3–4 times the shorter diameter (200 $\mu m$).

An experiment of etching processing is carried out with the wafer open at 0 rpm (stationary), 20 rpm, 50 rpm, 80 rpm, 100 rpm, 1,000 rpm and 3,000 rpm by employing vapor of hydrofluoric acid of 50% by weight. Table 1 shows a result of this experiment. In Table 1, o indicates that etching is possible while x indicates that etching is not possible.

TABLE 1

| Spinning speed | Size of Openings | | |
|---|---|---|---|
| | 1.2 μm | 3.0 μm | 200 μm |
| Stationary 0 rpm | o | o | o |
| 20 rpm | o | o | o |
| 50 rpm | o | o | o |
| 80 rpm | o | o | o |
| 100 rpm | x | x | o |
| 1,000 rpm | x | x | o |
| 3,000 rpm | x | x | o |

This experiment reveals the following. With the opening having a size of 3.0 μm or less, etching of the thermal silicon oxide film is possible when the wafer is spinning at 80 rpm or less. However, when the wafer is spinning at 100 rpm or more, etching is not obtained with the opening having the above indicated sizes.

Experiment in Accordance with the Present Invention

Etching, by a hydrofluoric acid vapor, of the surface of a wafer which is made hydrophilic, on which a water film is formed.

The same wafer is prepared as the one in the comparison experiment. As described above, a photoresist film is made hydrophilic by being exposed to ultraviolet rays. Pure water is supplied onto the surface of the hydrophilic photoresist film. This results in the formation of a water film on the inner surface of the micro openings in the photoresist film and on the surface of the thermal silicon oxide film in the openings. A vapor of hydrofluoric acid with a 50% weight ratio is supplied to the surface of the wafer, whereby a thermal silicon oxide film formed on the wafer is etched. The other conditions are maintained identical to those in the above-described comparison experiment. The spinning speed of the wafer is kept constant from the hydrophilic processing step to the hydrofluoric acid vapor supplying step. Table 2 shows a result of this experiment.

TABLE 2

| Spinning Speed | Size of Openings | | |
|---|---|---|---|
| | 1.2 μm | 3.0 μm | 200 μm |
| Stationary 0 rpm | o | o | o |
| 20 rpm | o | o | o |
| 50 rpm | o | o | o |
| 80 rpm | o | o | o |
| 100 rpm | o | o | o |
| 1,000 rpm | o | o | o |
| 3,000 rpm | o | o | o |

Table 2 reveals the following effects of the present invention. In Table 1, in the case of the 1.2 μm and 3.0 μm in opening sizes, etching is not possible with the wafer spinning at 100 rpm or more. However, according to Table 2, etching is possible for all the noted openings. For example, in case of the wafer spinning at high speed of 3,000 rpm, the micro opening with the size of 1.2 μm is satisfactorily etchable as well as the one with the size of 3.0 μm. That is, the thermal silicon oxide film is satisfactorily etchable even in case of a photoresist film having a micro opening diameter of 3.0 μm or less, by the method of treating the surface of the wafer according to the present invention.

Figure 8A:
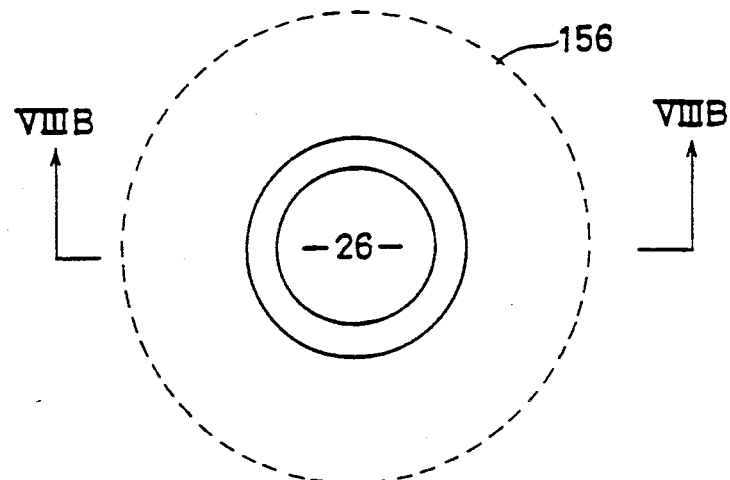
FIG. 8A is a plan view of a contact hole formed by etching.
Figure 8B:
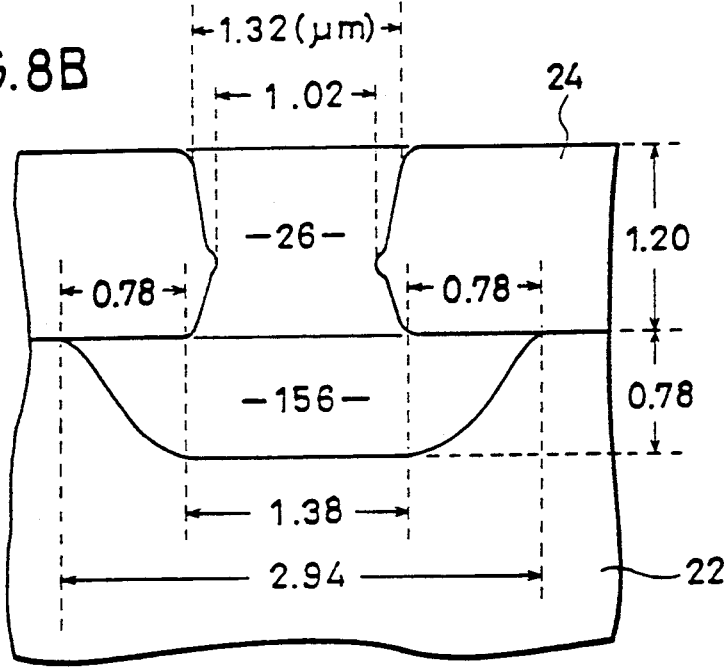
FIG. 8B is a cross sectional view taken along the direction of the arrow VIIIB—VIIIB of FIG. 8A.

FIGS. 8A and 8B show the form of a contact hole obtained by a circular opening of approximately 1.2 μm in diameter, in the above described experiment. Referring to FIGS. 8A and 8B, an opening 26 formed in a photoresist film 24 is roughly cylindrical, having a 1.32 μm diameter at the top surface of the photoresist film 24, a 1.8 μm diameter at an interface between the photoresist film 24 and thermal silicon oxide film 22, and a 1.02 μm diameter at the smallest portion. A contact hole 156 formed in the thermal silicon oxide film 22 has a circular shape of an approximately 2.94 μm diameter at the surface of the thermal silicon oxide film 22, and a circular shape 1.8 μm in diameter at the bottom thereof and a 0.78 μm depth.

As has been described, according to the first embodiment, it is possible to form the contact hole satisfactorily by etching the thermal silicon oxide film on the wafer by employing the photoresist film having the micro openings even while spinning the wafer.

As described above, the surface of the thin film having the micro opening and formed on the wafer is rendered hydrophilic by any of the following processings: (1) ultraviolet ray irradiation, (2) supplying of ozone at the same time as ultraviolet ray irradiation is applied, (3) exposure to an ozone atmosphere, (4) exposure to an $O_2$ plasma atmosphere, (5) exposure to anhydrous alcohol and (6) exposure to choline [$(CH_3)_3NC_2H_4OH$] or a choline derivative.

The above processings (1)–(4) produce active oxygen, so that the thin film is made hydrophilic by changing a methyl group (—$CH_3$) and an ethyl group (—$C_2H_5$) of the surface thereof into a hydroxyl group (—OH) and a carboxyl group (—COOH). In the processings (5) and (6), an alkyl group (—$C_nH_{2n+1}$) is adsorbed on the thin film surface making the surface thereof hydrophilic. The inner surface of the micro opening is satisfactorily made hydrophilic even in case of a very small micro opening of approximately 1.0 μm in diameter.

With pure water or pure water vapor supplied to the thin film after hydrophilic processing, a water molecule $H_2O$ is bonded to the surface of the thin film and to the inner surface of the micro opening since the film is hydrophilic, resulting in the formation of a water film extending over the surface of the thin film and the inner surface of the micro opening.

The water film is thus formed on even the inner surface of the very small micro opening of approximately 1.0 μm in diameter.

While spinning the wafer, hydrogen halogenide such as hydrogen fluoride HF or hydrogen chloride HCl, or a vapor containing hydrogen halogenide or the like (hereinafter simply referred to as "hydrogen halogenide") is supplied onto the wafer surface. This processing may be carried out after the water film is formed on the inner surface of the micro opening by pure water or pure water vapor supply, or alternatively it may be carried out at the same time as the pure water or pure water vapor supply.

In case where hydrogen halogenide is supplied after the formation of water film on the inner surface of the micro opening, the hydrogen halogenide being supplied easily dissolves and diffuses in the water film already formed.

In case where the hydrogen halogenide or the like is supplied simultaneously with the pure water or pure water vapor supply, the formation of water film on the inner surface of the micro opening proceeds simultaneously with the dissolving of hydrogen halogenide into the water film formed.

In both cases, the hydrogen halogenide satisfactorily dissolves in the water film even when the wafer is spinning at relatively high speed, in departure from the substitution of gas for gas. This dissolving enables permeation of hydrogen halogenide into the micro opening. The permeation of hydrogen halogenide into the micro opening is not due to a direct substitution for air in the micro opening.

The hydrogen halogenide dissolving in the water film becomes a solution of hydrogen halogenide, thereby etching the wafer surface exposed in the micro opening and thus forming a micro hole such as a contact hole therein.

In contrast, a conventional example (Japanese Patent Laying-Open Document No. 61-148820) neither employs spinning of the wafer nor discloses the following consideration as follows: In order to disclose a vapor in the water being permeated into a micro opening, a water film for dissolving the vapor should be formed in the micro opening. To this end, a thin film should be previously made hydrophilic. In addition, in the conventional art, alcohol is regarded merely as a rinsing medium for rinsing, when liquified, a reaction product produced by etching. The conventional art is fundamentally different from the present invention in this respect.

In accordance with the present invention, a micro opening in a hydrophobic thin film is made hydrophilic, so that a water film is formed on the inner surface of the micro opening made hydrophilic. Hydrogen halogenide dissolves in the water film formed and diffuses therein. Therefore, the wafer surface in the micro opening can be etched even when the wafer is spinning at high speed and even when the diameter of the micro opening is extremely small. The processing with high speed spinning makes it possible to perform a uniform treatment over the entire wafer surface and also enhance the efficiency of treatment.

Second embodiment

In the second embodiment, the hydrophilic processing of the surface of the photoresist film and the interior surface of the micro openings is carried out simultaneously with the formation of a water film on the surface of the photoresist film and the interior surface of the micro openings.

Figure 10A:
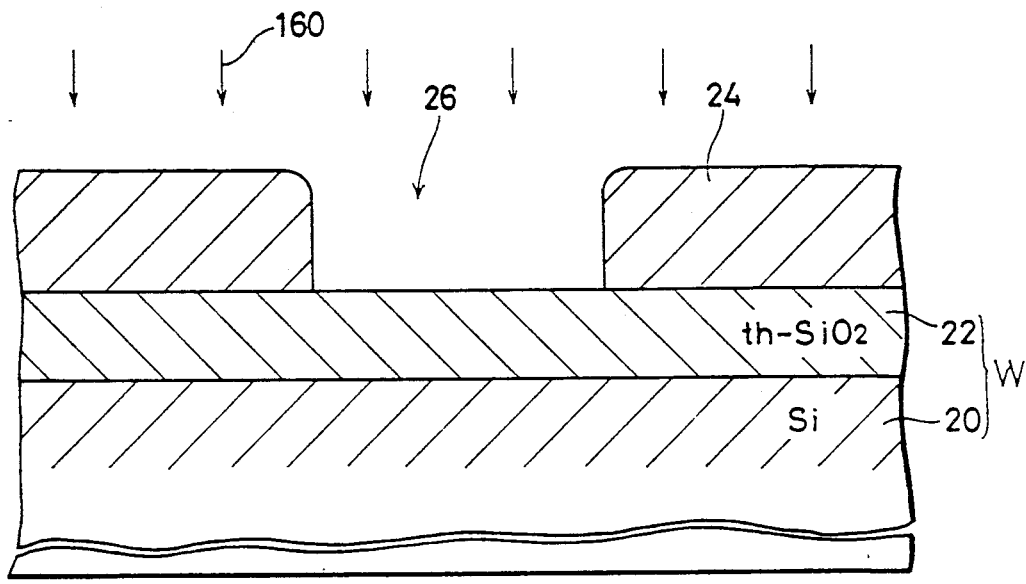
FIGS. 10A and 10B are cross sectional views of the wafer.

A device for performing the second embodiment is a wet processing tank similar to the etching processing portion 38 employed in the first embodiment. In place of the water vapor generating portion 44 is a device for supplying a solution which serves to make hydrophilic the surface of the photoresist film to the surface of the wafer W. Referring to FIG. 10A, a wafer W is prepared. The wafer W includes a silicon wafer 20, and a thermal silicon oxide film 22 is formed on a main surface of the silicon wafer 20. A photoresist film 24 is formed on the thermal silicon oxide film 22 and has a large number of micro openings 26.

In a first step, the wafer W is transported into the wet processing tank to be held by an internal spin chuck. The spin chuck is spun at high speed by the motor 62 or the like shown in FIG. 3, thereby spinning the wafer W at a high speed.

Referring to FIG. 10A, a jet of choline $[(CH_3)_3NC_2H_4OH]OH$ solution 160 is, for example, supplied out of a nozzle (not shown) or the like and supplied to the main surface of the wafer W.

Figure 10B:
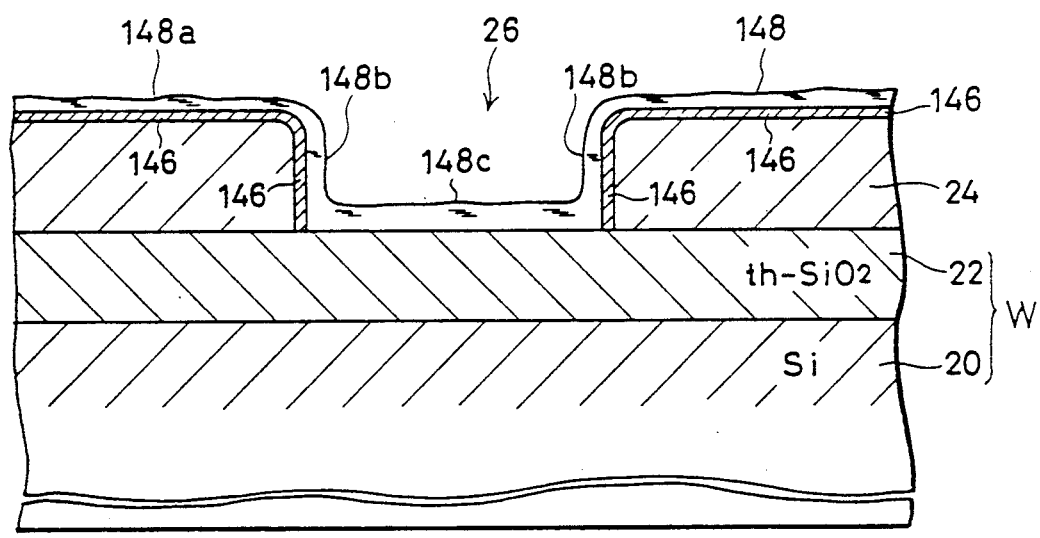

As described above, the photoresist film 24 has in its surface a methyl group and an ethyl group bonded to a carbon atom C. However, the alkyl group which belongs to the choline is bonded to a methyl group ($-CH_3$) and an ethyl group ($-C_2H_5$) which have been bonded to the carbon atom C in the surface of the photoresist film 24, whereby the surface is covered with hydroxyl group ($-OH$) which belong to the choline. Thus, a polar group which is the hydroxyl group is formed in the surface of the photoresist film 24. Therefore, referring to FIG. 10B, the surface of the photoresist film 24 is made hydrophilic thereby forming a hydrophilic resist film 146. Simultaneously, a water molecule $H_2O$ contained in the choline solution 160 shown in FIG. 10A is bonded to the hydroxyl group ($-OH$) in the surface of the photoresist film 24. This causes water films 148a, 148b and 148c having uniform thicknesses to be formed on the surface of the hydrophilic photoresist film 146 and on the surface of the thermal silicon oxide film 22.

In a second step, the wafer W is kept spinning at high speed by the spin chuck in the same wet processing tank. A vapor of hydrofluoric acid is then supplied uniformly onto the surface of the wafer W. The subsequent steps are the same as the steps already described in the first embodiment with reference to FIGS. 7D and 7E. Therefore, a detailed description thereof will not be repeated here.

This embodiment is characterized in that the step of making hydrophilic the surface of the photoresist film 24 hydrophilic and the step of forming the water film on the surface of the photoresist film 24 are carried out simultaneously. These steps can be carried out simultaneously by preparing a solution of a hydrophilic agent serving to make the photoresist film 24 hydrophilic. This makes both the processing and also the structure of the device simple.

The solution for making the photoresist film 24 hydrophilic can be selected as one of the above-described choline solution, an alcohol solution such as of methanol $CH_3OH$ or ethanol $C_2H_5OH$, a choline derivative solution such as of tetraethyl ammonium hydroxide $[(C_2H_5)_4N]OH$ or tetraalkyl ammonium hydroxide $[(C_nH_{2n+1})_4N]OH$, a surface active agent, etc. As a suitable surface active agent for surface treatment of this substrate, NCW-601A manufactured by WAKO PURE CHEMICAL INDUSTRIES, Ltd. ("NCW" is a trademark of the same company) is proposed.

The above-described solution or the like having a function of making the hydrophobic surface hydrophilic is hereinafter referred to as "the first solution".

The wafer 1 may be held stationary in the step of hydrophilic processing of the inner surface of the micro opening.

After the formation of the water film, an anhydrous gas of hydrogen fluoride HF may be supplied to the wafer surface in place of the vapor of hydrofluoric acid ($HF+H_2O$). A vapor of hydrochloric acid solution ($HCl+H_2O$), a vapor containing hydrogen halogenide such a gaseous anhydrous hydrogen chloride HCl, or a hydrogen halogenide gas may be supplied in place of the vapor of hydrofluoric acid ($HF+H_2O$) or the anhydrous gas of hydrogen fluoride HF.

The surface of a thin film such as a resist formed on the wafer and having micro openings is hydrophobic since it is covered with a methyl group ($-CH$ ), an ethyl group ($-C_2H_5$) and the like. However, by supplying the first solution to the surface thereof, an alkyl group ($-C_nH_{2n+1}$) of the solution is physically adsorbed to the methyl group ($-CH_3$), ethyl group ($-C_2H_5$) and the like on the surface of the thin film. Consequently, a hydroxyl group ($-OH$) which makes a pair with the alkyl group covers the thin film surface on the wafer to make the same hydrophilic.

The first solution or vapor thereof contains a water molecule $H_2O$ in itself. This results in formation of a water film extending over the surface of the thin film and over the inner surface of the micro opening.

That is, the water film is formed during the hydrophilic processing. In this case also, similarly to the first embodiment, the water film is formed on even the inner surface of an extremely small micro opening of approximately 1.0 μm in diameter.

After the hydrophilic processing and the formation of the water film, hydrogen halogenide such as hydrogen fluoride HF or hydrogen chloride HCl, or a vapor containing hydrogen halogenide is supplied while spinning the wafer. The hydrogen halogenide or the like then easily dissolves and diffuses in the water film already formed. This dissolving is satisfactorily performed even when the wafer is spinning at relatively high speed. This dissolving of hydrogen halogenide or the like enables permeation of hydrogen halogenide into the micro opening. The hydrogen halogenide dissolving in the water film becomes a solution and etches the wafer surface exposed in the micro opening.

Third Embodiment

In case where a micro opening such as a trench is formed in a wafer by dry etching, organic and inorganic impurities sometimes adhere onto the inner surface of the micro opening during dry etching. The third preferred embodiment is an application of a method of treating a wafer surface in accordance with the present invention to a processing of removing impurities in the micro opening.

Figure 11:
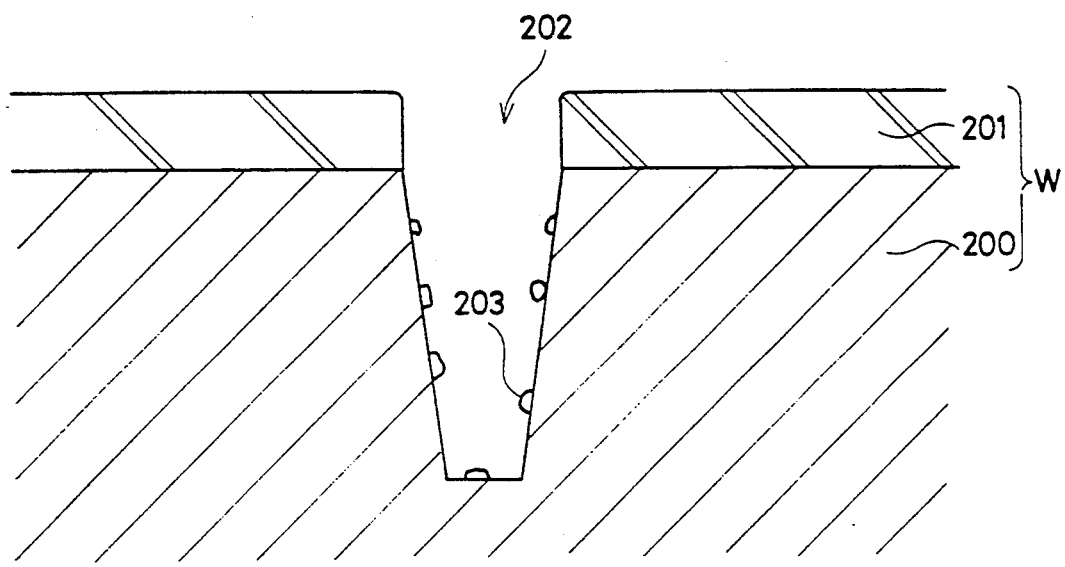
FIGS. 11-14 are cross sectional views of a wafer having a trench formed on its surface.

FIG. 11 is a cross sectional view of a wafer W having a micro opening formed by dry etching. The wafer W includes a silicon wafer 200 (bare silicon Si) forming a portion of the wafer W and a silicon oxide film ($SiO_x$) 201 formed on the surface of the wafer W prior to dry etching. The silicon oxide film 201 is formed, before dry etching the wafer in a desired pattern, on the wafer other than portions thereof to be dry etched. The silicon oxide film 201 serves as etching mask in dry etching.

A micro opening 202 is formed in the silicon oxide film 201 by dry etching. The diameter of the micro opening is 0.8–3.0 μm. Organic and inorganic impurities 203 adhere to the inner surface of the micro opening 202 during dry etching.

The silicon oxide film 201 covers surface of the silicon wafer 200 where micro opening 202 is not formed. The surface of silicon oxide film 201 is composed of the Si—O—Si or Si—OH substances and is hydrophilic. The inner surface of the micro opening 202 is, however, formed of so-called bare silicon (Si) with the exposed silicon wafer 200 and is hydrophobic.

In the third embodiment, the following processing steps are carried out for the wafer W in which the micro opening 202 is formed by dry etching. In the first step, the wafer W is transported into the hydrophilic processing portion 36 (see FIG. 3) and held by the spin chuck 50 therein. With the spin chuck 50 spinning at high speed, ultraviolet rays (a wavelength 184.9-253.7 nm) are directed from the low-pressure mercury lamp 48 or the like to the wafer.

Figure 12:
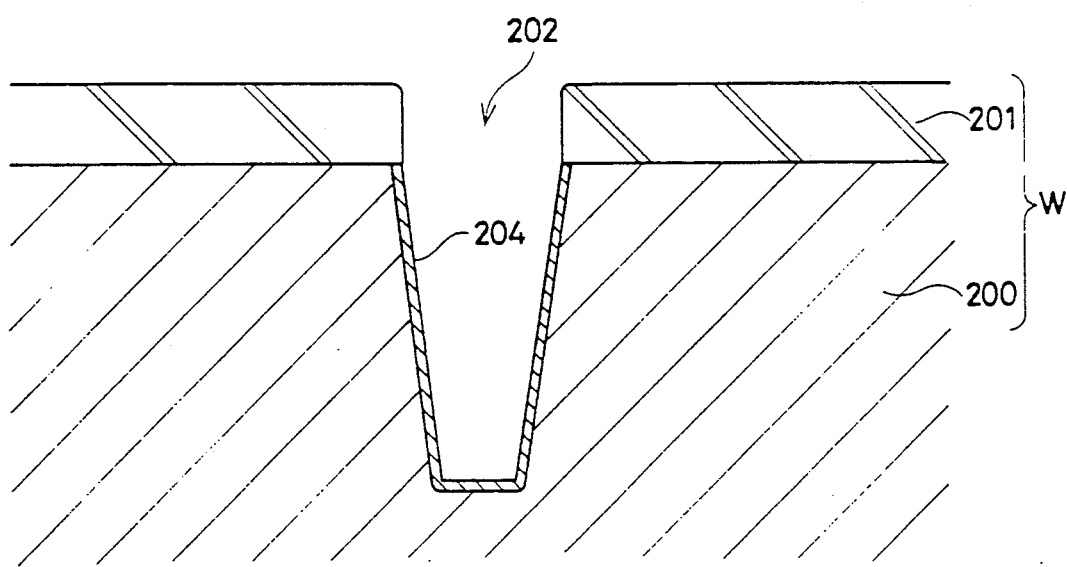

Ultraviolet rays cause an oxide film ($SiO_2$) 204 of several 10 Å in thickness containing the inorganic impurities 203 therein to be formed on the inner surface of the micro opening 202, as shown in FIG. 12. Since the oxide film 204 is hydrophilic, the inner surface of the micro opening 202 also becomes hydrophilic. This entails decomposition of the organic impurities adhering to the inner surface of the micro opening 202.

In the second step, the wafer W is transported into the etching processing portion 38 and held by the spin chuck 60 therein. A jet of pure water 205 is supplied to the wafer W with the spin chuck spinning at high speed.

Figure 13:
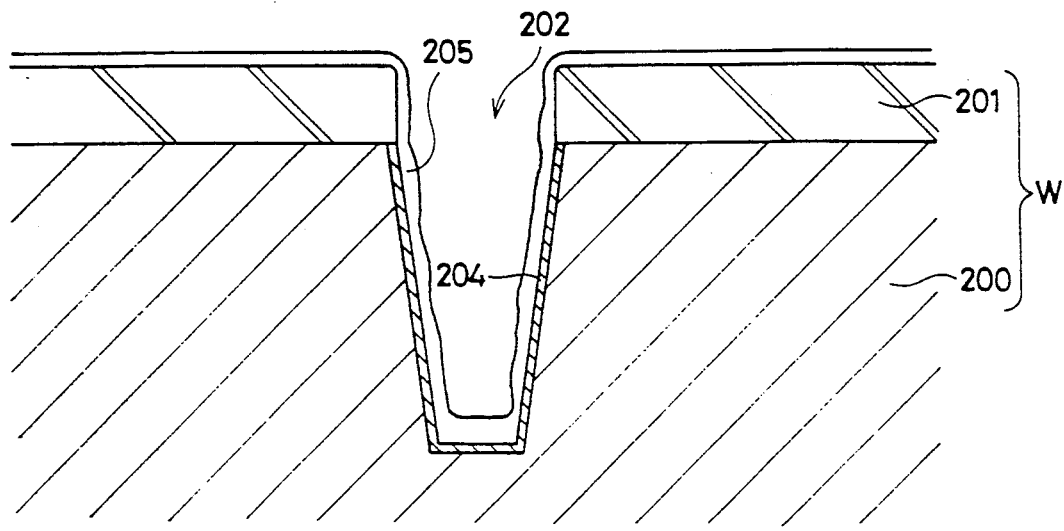

In the surface of the wafer W, a water molecule $H_2O$ of pure water 205 reaching the surface of the wafer W is bonded to the inner surface of the micro opening 202, thereby forming a water film 205 extending over the surface of the silicon oxide film 201 and the inner surface of the micro opening 202, as shown in FIG. 13.

As in the foregoing manner, the water film is formed on the silicon oxide film even on the inner surface of the considerably small micro opening 202 of approximately 1.0 μm in diameter.

In the third step, a vapor of hydrofluoric acid ($HF+H_2O$) is supplied to the wafer W with the spin chuck 60 spinning at a high speed (1000-3000 rpm) in the same etching processing portion 38 as above. This vapor of hydrofluoric acid ($HF+H_2O$) is, for example, a vapor of 50% hydrofluoric acid ($HF+H_2O$). An anhydrous gas of hydrogen fluoride HF may be employed in place of the hydrofluoric acid ($HF+H_2O$) vapor.

The vapor of hydrofluoric acid ($HF+H_2O$) dissolves in and diffuses in the water film 205 covering the inner surface of the micro opening 202 so as to become a solution of hydrofluoric acid. The hydrofluoric acid solution etches the silicon oxide film (containing the inorganic impurities 203) formed on the inner surface of the micro opening 202 to wash the inner surface thereof.

Even when the wafer W is spinning at a high speed, the hydrofluoric acid ($HF+H_2O$) vapor satisfactorily dissolves in the water film 205. Accordingly, the inner surface of the micro opening 202 is also satisfactorily washed. Moreover, since this processing is carried out while spinning the wafer W at a high speed, the inner surface of all the micro openings 202 is uniformly washed. The inorganic impurities which become fluoride in the etching step are removed by pure water.

The present invention also includes the following modification of the third embodiment.

(a) The hydrophilic processing of the inner surface of the micro opening 202 can be achieved by the following methods other than the ultraviolet ray directing method. That is, active oxygen generated by (1) supplying ozone along with ultraviolet rays, (2) exposure to ozone atmosphere and (3) exposure to $O_2$ atmosphere allows an oxide film to be formed on the inner surface of the micro opening 202 thereby making the surface thereof hydrophilic.

Furthermore, such a method as (4) exposure to anhydrous alcohol or (5) exposure to choline [$(CH_3)_3NC_2H_4OH$] or to choline derivative allows the inner surface of the micro opening 202 to be hydrophilic. In the processings (4) and (5), however, the oxide film 204 is not formed on the inner surface of the micro opening 202 by hydrophilic processing. The impurities 203 are removed along with the inner surface of the micro opening to be etched when hydrogen halogenide or a vapor containing hydrogen halogenide is supplied to the wafer W.

(b) The pure water supplied to form the water film 205 after hydrophilic processing may be replaced with a vapor of pure water.

(c) The hydrofluoric acid (HF+H$_2$O) vapor may be supplied at the same time as the supply of pure water or pure water vapor for forming the water film 205 in place of being supplied after the formation of water film 205. Also in this case, anhydrous hydrogen fluoride HF gas may be supplied in place of the hydrofluoric acid (HF+H$_2$O) vapor.

A vapor of hydrochloric acid solution (HCl+H$_2$O), a vapor containing hydrogen halogenide such as anhydrous hydrogen chloride HCl gas, or a gas of hydrogen halogenide may be supplied in place of a vapor of hydrofluoric acid (HF+H$_2$O) or anhydrous hydrogen fluoride HF gas.

(d) The wafer W may be held stationary in the step of hydrophilic processing of the inner surface of the micro opening 202 and in the step of supplying pure water or pure water vapor to the inner surface of the micro opening 202.

In case of washing the inner surface of the micro opening formed in the wafer such as in the step of washing the inside of a trench, an oxide film is formed on the wafer. The wafer is thus hydrophilic. The inner surface of the micro opening is, however, hydrophobic since it is formed of silicon itself (bare silicon). The inner surface of the micro opening is made hydrophilic by any of the following processings: (1) exposure to ultraviolet ray irradiation, (2) supply of ozone at the same time as ultraviolet ray irradiation, (3) exposure to ozone atmosphere, (4) exposure to O$_2$ plasma atmosphere, (5) exposure to anhydrous alcohol, and (6) exposure to choline [(CH$_3$)$_3$NC$_2$H$_4$OH] or to choline derivative. The processings (1) through (4) enable the hydrophilic processing of the inner surface of the micro opening by producing active oxygen on the inner surface of the micro opening to produce a thin oxide film thereon. In the processings (5) and (6), an alkyl group (—C$_n$H$_{2n+1}$) is adsorbed to the surface of the thin film to make the adhered portion hydrophilic. The hydrophilic processing of the inner surface of the micro opening is satisfactorily carried out even in case with an extremely small micro opening of approximately 1.0 μm in diameter.

When pure water or pure water vapor is supplied to the wafer after hydrophilic processing of the inner surface of the micro opening, the pure water or pure water vapor permeates into the micro opening which is highly permeable because of the hydrophilic inner surface thereof. A water molecule H$_2$O of pure water or pure water vapor permeating into the micro opening is bonded to the inner surface of the micro opening, thereby forming a water film extending over the surface of the oxide film and across the oxide film on the inner surface of the micro opening.

As for the pure water vapor, only a small proportion thereof directly permeates into the micro opening. However, a water film is formed on the inner surface of the micro opening since water produced by liquefaction of a vapor contacting the surface of the oxide film on the wafer flows into the micro opening. The water is able to flow into the micro opening because the oxide film formed on the inner surface of the micro opening makes the inner surface thereof hydrophilic.

As has been described, the water film is formed even in the inner surface of the extremely small micro opening of approximately 1.0 μm in diameter.

Hydrogen halogenide such as hydrogen fluoride HF or hydrogen chloride, or a vapor containing hydrogen halogenide or the like (referred to as "hydrogen halogenide") is supplied while spinning the wafer. The hydrogen halogenide being supplied is capable of satisfactorily dissolving in the water film, entirely similar to the first and second embodiments. This dissolving allows the hydrogen halogenide to permeate into the micro opening.

The hydrogen halogenide dissolving in the water film becomes a solution of hydrogen halogenide thereby etching the inner surface of the micro opening and then washing the inside of the micro opening.

According to the third preferred embodiment, the inner surface of the micro opening formed in the wafer is made hydrophilic so as to form a water film thereon. The hydrogen halogenide then dissolves in the water film formed and diffuses therein. Therefore, it is possible to wash the inside of the micro opening by etching the inner surface thereof even if the wafer is spinning at high speed and the micro opening has an extremely small diameter. Further, the processing with the wafer spinning at high speed enables a uniform treatment over the entire wafer and an enhanced efficiency of treatment.

Fourth Embodiment

Referring again to FIGS. 11–14, the fourth embodiment comprise an application of the wafer surface treating method of the present invention to the process of removing organic and inorganic impurities 203 adhering to the inner surface of a micro opening 202 such as a trench formed in a wafer W by dry etching such as in Reactive Ion Etching.

In the fourth embodiment, the wafer W to be treated includes a silicon wafer (bare silicon Si) 200 and a silicon oxide film 201 formed on the surface of the silicon wafer 200, in the same manner as described for the wafer W in the third embodiment shown in FIG. 11. The micro opening 202 is formed in the silicon wafer 200 by dry etching with the silicon oxide film 201 serving as etching mask. The diameter of the micro opening 202 is 0.8–3.0 μm.

Figure 14:
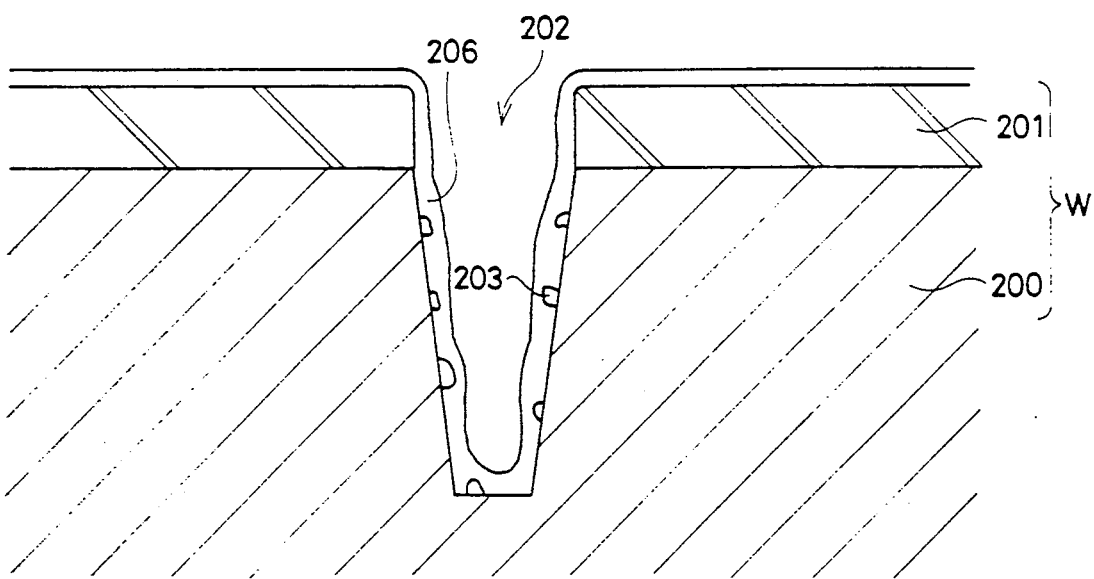

In this embodiment, in the first step, the wafer W is transported into the etching processing portion 38 (FIG. 3) and is held by the spin chuck 60 therein. With the spin chuck 60 spinning at high speed, a choline [(CH$_3$)$_3$NC$_2$H$_4$OH] solution 206 is jetted out of a nozzle to be supplied to the wafer W, as shown in FIG. 14.

The inner surface of the micro opening 202 is hydrophobic. The choline solution 206, however, permeates into the micro opening 202 to lightly etch the surface thereof. A hydroxyl group (—OH) contained in choline bonds to a silicon group (—Si) constituting the inner surface of the micro opening 202 so as to make the inner surface thereof hydrophilic. A water molecule H$_2$O in the choline solution is bonded to the inner surface of the micro opening 202 made hydrophilic, thereby forming a water film 206 extending over the surface of the silicon oxide film 201 and across the inner surface of the micro opening 202.

As described before, the water film 206 forms even on the inner surface of the extremely small micro opening 202 of approximately 1.0 μm in diameter of the silicon oxide film.

In the second step, a vapor of hydrofluoric acid (HF+H$_2$O) is supplied to the wafer W with the spin chuck 60 spinning at high speed (1000–3000 rpm) in an identical etching processing portion 38 previously described. The vapor of hydrofluoric acid (HF+$H_2O$) is, for example, of 50% hydrofluoric acid (HF+$H_2O$). An anhydrous gas of hydrogen fluoride HF may be employed in place of the hydrofluoric acid (HF+$H_2O$) vapor.

The hydrofluoric acid (HF+$H_2O$) vapor dissolves in the water film 206 covering the inner surface of the micro opening 202 and diffuses therein, becoming a solution of hydrofluoric acid (HF+$H_2O$). The hydrofluoric acid (HF+$H_2O$) solution etches and washes the inner surface of the micro opening 202.

Even if the wafer 200 is spinning at high speed, the hydrofluoric acid (HF+$H_2$) vapor satisfactorily dissolves in the water film 206 and also satisfactorily washes the inner surface of the micro opening 202. Since this processing is carried out while the wafer 200 spins at high speed, the inner surface of all the micro openings 202 is uniformly washed.

The fourth preferred embodiment can be modified as follows.

(a) As a solution for making the inner surface of the micro opening 202 hydrophilic, the choline [$(CH_3)_3NC_2H_4OH$] solution may be replaced by the above-described first solution, i.e., a choline derivative solution such as of tetraalkyl ammonium hydroxide [$(C_nH_{2n+1})_4NOH$] like tetraethyl ammonium hydroxide [$(C_2H_5)_4NOH$], or alternatively a surface active agent.

Further, a water solution of alcohol such as methanol $CH_3OH$ or ethanol $C_2H_5OH$ may be employed. In case of employing an alcohol water solution, the inner surface of the micro opening 202 is rendered hydrophilic because an alkyl group ($-C_nH_{2n+1}$) is adsorbed to the inner surface thereof.

(b) While the wafer W is spinning in this embodiment, it may be held stationary during the treatment.

As described above, in case of etching and washing the inner surface of the micro opening, e.g., a so-called trench formed in the wafer, the oxide film formed on the wafer is hydrophilic; however, the inner surface of the micro opening is hydrophobic since it is formed of silicon itself (bare silicon).

Even if the inner surface of the micro opening is hydrophobic, the above-described first solution or a vapor thereof supplied to the wafer and serving to make the inner surface of the micro opening hydrophilic permeates into the micro opening.

When the first solution is of alcoholic substances, an alkyl group ($-C_nH_{2n+1}$) thereof is adsorbed to the surface of bare silicon (Si), and consequently, a hydroxyl group ($-OH$) which is in pair with the alkyl group covers the surface of the wafer to make it hydrophilic.

When the first solution is of choline substances, the first solution etches the surface of bare silicon (Si). Consequently, the surface of the micro opening is covered with the hydroxyl group ($-OH$), thereby rendering the inner surface of the micro opening hydrophilic.

The foregoing first solution or its vapor contains a water molecule $H_2O$ as such. The water molecule $H_2O$ is bonded to the inner surface of the micro opening, thereby forming a water film over the surface of the oxide film and across the inner surface of the micro opening.

That is to say, the first solution can permeate into the micro opening to make the inner surface thereof hydrophilic and also form the water film at the same time. Also in this case, similarly to the third method, the water film is formed even in the inner surface of the extremely small micro opening of approximately 1.0 μm in diameter.

After the water film is formed on the inner surface of the micro opening, hydrogen halogenide such as hydrogen fluoride HF or hydrogen chloride HCl or a vapor containing hydrogen halogenide is supplied to the surface of the spinning wafer. Consequently, hydrogen halogenide or the like easily dissolves and diffuses in the water film.

The dissolving of hydrogen halogenide or the like in the water film is satisfactorily carried out even if the wafer is spinning at relatively high speed, differently from the substitution of gas for gas. This dissolving of hydrogen halogenide or the like in the water film enables permeation of the same into the micro opening.

The hydrogen halogenide or the like dissolving in the water film becomes a hydrogen halogenide solution which washes the inside of the micro opening.

As has been described heretofore, according to the fourth preferred embodiment of the present invention, the first solution or its vapor having a hydrophilic function is supplied to the wafer surface in which the micro opening is formed. The first solution or its vapor permeates into the hydrophobic micro opening to make the inner surface thereof hydrophilic. The water molecule $H_2O$ of the first solution or its vapor is then bonded to the hydrophilic inner surface of the micro opening, thereby forming a water film on the inner surface of the micro opening.

Hydrogen halogenide or a vapor containing hydrogen halogenide dissolves and diffuses in the water film. Accordingly, it is possible to wash the inside of the micro opening by etching the inner surface thereof even when the wafer is spinning at high speed or the micro opening has an extremely small diameter. The high speed spinning of the wafer enables a uniform treatment over the entire wafer and also enhances the efficiency of treatment.

Although the present invention has been described an illustrated in detail, it is to be clearly understood that the same is by way of illustration and example only and is not to be taken by way of limitation, the spirit and scope of the present invention being limited only by the terms of the appended claims.

What is claimed is:

1. A method for treating a main surface of a wafer having a hydrophobic thin film with micro openings therein, said method comprising the steps of:
   (a) rendering said hydrophobic thin film hydrophilic;
   (b) supplying pure water or pure water vapor to said thin film that has been rendered hydrophilic in a manner that is effective to form a film of water on said thin film and on interior surfaces of said micro openings; and
   (c) supplying hydrogen halogenide or vapor including the same to said thin film while spinning said wafer at a predetermined speed simultaneously with or after said pure water or pure water vapor supplying step, to thereby cause said hydrogen halogenide to diffuse into said water film, so as to uniformly etch said wafer including said interior surfaces of said micro openings.

2. The method in accordance with claim 1, wherein said hydrogen halogenide comprises hydrogen fluoride.

3. The method in accordance with claim 1, wherein said step of rendering said thin film hydrophilic comprises the step of supplying to said thin film a hydrophilic agent for making said thin film hydrophilic.

4. The method in accordance with claim 3, wherein said hydrophilic agent comprises alcohol.

5. The method in accordance with claim 1, wherein said water supply step is carried out simultaneously with or after said hydrogen halogenide supplying step.

6. The method in accordance with claim 1, wherein said step of rendering said thin film hydrophilic comprises the step of directing ultraviolet rays onto said thin film.

7. The method in accordance with claim 1, wherein said hydrogen halogenide supplying step comprises the step of supplying water in liquid phase to the surface of said thin film.

8. The method in accordance with claim 1, wherein said hydrogen halogenide supplying step comprises the step of supplying water in vapor phase to the surface of said thin film.

9. The method as recited in claim 1, wherein said micro openings are less than or equal to 3 μm in diameter, and said predetermined speed is more than or equal to 80 r.p.m.

10. The method as recited in claim 1, wherein said step of rendering said hydrophobic thin film hydrophilic is carried out by conducting at least one of the steps of irradiating said wafer with ultraviolet radiation, applying an ozone to said wafer and concurrently ultraviolet radiation, exposing said wafer to an ozone atmosphere, exposing said wafer to $O_2$ plasma, exposing said wafer to anhydrous alcohol, and exposing said wafer to choline or a choline derivative.

11. A method for treating a main surface of a wafer having a hydrophobic thin film with micro openings therein, said method comprising the steps of:
   (a) supplying said hydrophobic thin film with a water solution or vapor thereof, said water solution and said vapor being effective to render said hydrophobic thin film hydrophilic, and to form a water film on said thin film and on interior surfaces within said micro openings, said water solution selected from the group consisting of alcohol water solution, choline water solution, choline derivative water solution and surface active agent; and
   (b) supplying hydrogen halogenide or vapor including the same to said thin film while spinning said wafer at a predetermined speed, to thereby cause said hydrogen halogenide to diffuse into said water film, so as to uniformly etch said wafer including said interior surfaces of said micro openings.

12. The method in accordance with claim 11, wherein said water solution supplying step comprises the steps of
   preparing a mixture in vapor phase of said hydrophilic agent and water, and
   supplying said vapor phase mixture to said thin film.

13. The method in accordance with claim 12, wherein said hydrophilic agent is selected from the group consisting of alcohol, choline, choline derivative and a surface active agent.

14. The method as recited in claim 11, wherein said micro openings are less than or equal to 3 μm in diameter, and said predetermined speed is more than or equal to 80 r.p.m.

15. A method for treating a main surface of a wafer wherein said main surface has micro openings formed therein and hydrophobic interior surfaces in said openings, said method comprising the steps of:
   (a) rendering hydrophilic said hydrophobic interior surfaces of said micro openings;
   (b) supplying said main surface of said wafer and said micro openings with pure water or water vapor to thereby form a film of water on said main surface and on said interior surfaces of said micro openings that have been rendered hydrophilic; and
   (c) supplying said main surface of said wafer and said micro openings with hydrogen halogenide or vapor including the same while spinning said wafer at a predetermined speed simultaneously with or after said pure water or pure water vapor supplying step, to thereby cause said hydrogen halogenide to diffuse into said wafer film, so as to uniformly treat said main surface of said wafer and said micro openings.

16. The method as recited in claim 15, wherein said hydrophilic rendering step includes at least one of the steps of ultraviolet irradiating said wafer, exposing said wafer to an ozone atmosphere, and exposing said wafer to $O_2$ plasma.

17. The method as recited in claim 15, wherein said main surface supplying step is conducted while spinning said wafer.

18. The method as recited in claim 15, wherein said micro openings are less than or equal to 3 μm in diameter, and said predetermined speed is more than or equal to 80 r.p.m.

19. The method as recited in claim 15, wherein said step of rendering said hydrophobic thin film hydrophilic is carried out by conducting at least one of the steps of irradiating said wafer with ultraviolet radiation, applying an ozone to said wafer and concurrently ultraviolet radiation, exposing said wafer to an ozone atmosphere, exposing said wafer to $O_2$ plasma, exposing said wafer to anhydrous alcohol, and exposing said wafer to choline or a choline derivative.

20. A method for treating a main surface of a wafer having micro openings formed therein and hydrophobic interior surfaces associated with said openings, said method comprising the steps of:
   (a) supplying said micro openings with a water solution or vapor thereof, said water solution and said vapor being effective for rendering hydrophilic said hydrophobic interior surfaces of said micro openings, to thereby form a water film on said interior surfaces that have been rendered hydrophilic, said water solution selected from the group consisting of alcohol water solution, choline water solution, choline derivative solution and surface active agent; and
   (b) supplying said micro openings with hydrogen halogenide or vapor including the same while spinning said wafer at a predetermined speed, to thereby cause said hydrogen halogenide to diffuse into said water film, so as to uniformly treat said main surface of said wafer including said micro openings.

21. The method as recited in claim 20, wherein said step micro opening supplying is conducted while spinning the wafer.

22. The method as recited in claim 20, wherein said water solution is selected from the group consisting of alcohol water solution, anhydrous alcohol water solution, choline water solution, choline derivative water solution, and surface active agent.

23. The method as recited in claim 20, wherein said micro openings are less than or equal to 3 μm in diameter, and said predetermined speed is more than or equal to 80 r.p.m.

* * * * *